United States Patent [19]

Miyata et al.

[11] Patent Number: 5,355,056
[45] Date of Patent: Oct. 11, 1994

[54] SPARKPLUG VOLTAGE DETECTING PROBE DEVICE FOR USE IN INTERNAL COMBUSTION ENGINE

[75] Inventors: Shigeru Miyata; Yasuo Ito; Hideji Yoshida, all of Nagoya, Japan

[73] Assignee: NGK Spark Plug Co., Ltd., Nagoya, Japan

[21] Appl. No.: 59,370

[22] Filed: May 12, 1993

[30] Foreign Application Priority Data

May 12, 1992 [JP] Japan .................. 4-118620
Sep. 30, 1992 [JP] Japan .................. 4-261246

[51] Int. Cl.$^5$ ............................ H05B 37/02
[52] U.S. Cl. ................ 315/209 CD; 315/209 T; 315/209 M; 315/111.01; 431/254; 431/255; 431/256
[58] Field of Search ....... 315/209 CD, 209 T, 209 M, 315/111.01; 431/254, 255, 256; 340/385

[56] References Cited

U.S. PATENT DOCUMENTS 4,341,195 7/1982 Nishio et al. .............. 315/209 CD
4,369,757 1/1983 Anzai ...................... 315/209 CD
5,056,496 10/1991 Morino et al. .............. 315/209 CD Primary Examiner—Benny Lee
Assistant Examiner—Reginald A. Ratliff
Attorney, Agent, or Firm—Sughrue, Mion, Zinn, Macpeak & Seas

[57] ABSTRACT

In a sparkplug voltage detecting probe device for use in internal combustion engine comprising, a sensor is provided to form a static capacity between the sensor and an ignition coil which is connected to a spark plug. A sparkplug voltage divider circuit has a capacitor connected between the sensor and the ground. A release circuit has a resistor connected in parallel with the capacitor so as to provide a time constant of a RC path. A short circuit is provided to instantaneously release an electrical charge from the capacitor either immediately before establishing a spark voltage for the spark plug or immediately after initiating the spark action of the spark plug. A sparkplug voltage waveform detecting circuit detects a sparkplug voltage waveform divided by the sparkplug voltage divider circuit.

4 Claims, 4 Drawing Sheets

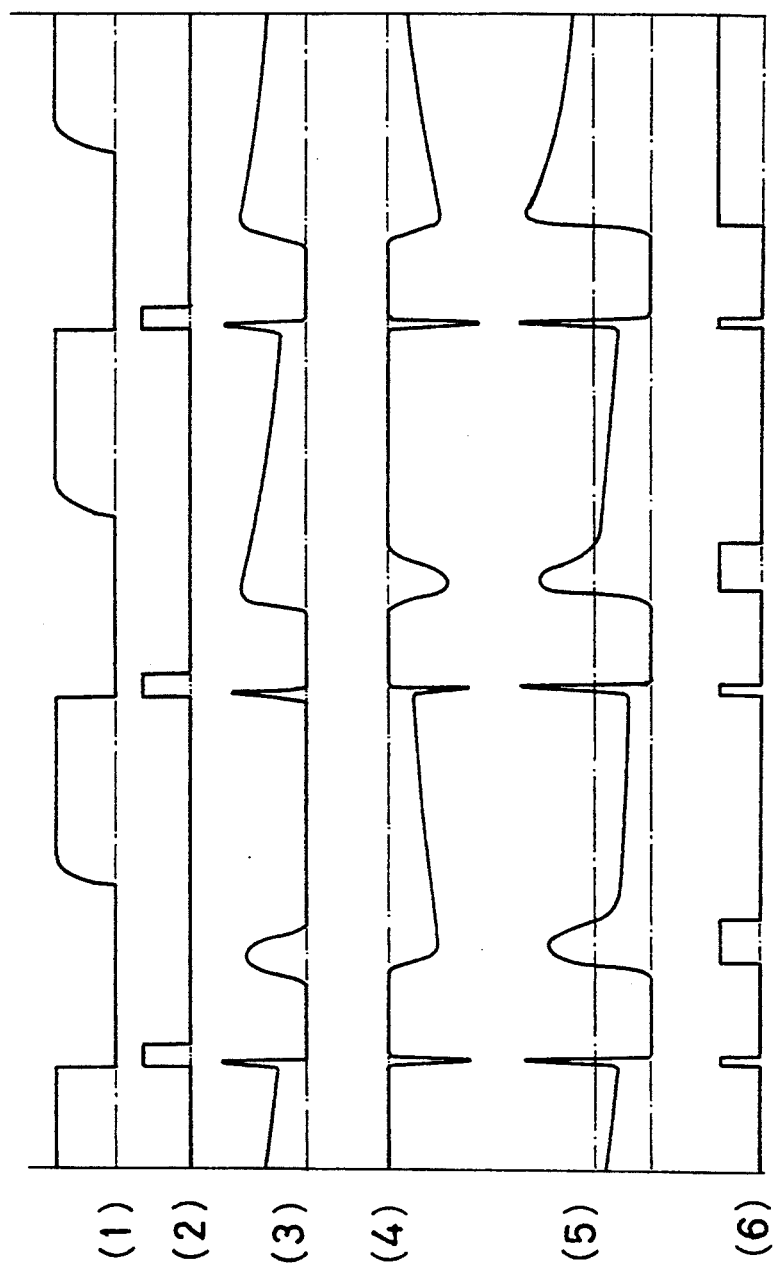

SPARKPLUG VOLTAGE DETECTING PROBE DEVICE FOR USE IN INTERNAL COMBUSTION ENGINE

BACKGROUND OF THE INVENTION

1. Field of the Invention

This invention relates to a sparkplug voltage detecting probe device which detects a sparkplug voltage waveform applied to a spark plug in an internal combustion engine.

2. Description of Prior Art

With the demand of purifying emission gas and enhancing fuel efficiency of internal combustion engine, it has been necessary to detect firing conditions in each cylinder of the internal combustion engine so as to protect the internal combustion engine against any type of misfire. In order to detect the firing condition in each of the cylinders, the applicant of the present patent application discloses a misfire detecting device in patent application No. 3-80107. In this device, a sensor is provided to form a static capacity between the sensor and a secondary circuit of an ignition coil, and a sparkplug voltage divider circuit is provided to divide the sparkplug voltage by the static capacity and a capacitor connected between the sensor and the ground. In parallel with the capacitor, a resistor is connected to form a RC path. The step-up level of the sparkplug voltage is detected after a spark plug terminates the spark action. The device is made on the fact that the step-up level is enhanced more when a misfire occurs than when the normal combustion occurs.

In this device, it is, however, necessary to determine a time constant of the RC path to be approximately 10 milliseconds so as to detect a sparkplug voltage waveform within an ignition timing of all the rpm region from low rpm to high rpm of an internal combustion engine.

When it takes long time for the step-up sparkplug voltage to be released, the subsequent spark action has been initiated before the capacitor had been completely discharged to raise a zero point level (reference voltage level) more than the ground voltage level. For this reason, the average level of the sparkplug voltage becomes relatively high to raise the zero point level so as to make the sparkplug voltage waveform sink under the zero point level. This is particularly true when the misfire often occurs, otherwise the spark action includes ineffective spark discharge which appears in a stroke of exhaustion as with the case in which a distributorless igniter (DLI) is incorporated into a sparkplug voltage detecting probe.

From the reason that the burning conditions in a cylinder are detected by measuring the sparkplug voltage level exceeding the zero point level, the detection precision the burning conditions deteriorates when the step-up level of the sparkplug voltage after the end of the spark action is not high with the engine running at low rpm. Especially in the sparkplug voltage detecting probe into which DLI is incorporated, the variation of the sparkplug voltage waveform caused from the ineffective spark discharge is small so as to worsen the detection precision.

Therefore, it is an object of the invention to provide a sparkplug voltage detecting probe device for use in internal combustion engine which is capable of preventing the zero point level of the reference voltage from inadvertently rising, and precisely detecting a characteristic of the sparkplug voltage waveform in all the rpm region from low rpm to high rpm of an internal combustion engine.

SUMMARY OF THE INVENTION

According to the invention, there is provided a sparkplug voltage detecting probe device for use in internal combustion engine. In the device, a sparkplug voltage divider circuit has a capacitor connected between the sensor and the ground. A release circuit has a resistor connected in parallel with the capacitor so as to provide a time constant of a RC path. A short circuit is provided to instantaneously release an electrical charge from the capacitor either immediately before establishing a spark voltage for the spark plug or immediately after initiating the spark action of the spark plug. A sparkplug voltage waveform detecting circuit detects a sparkplug voltage waveform divided by the sparkplug voltage divider circuit.

Such is the structure that the electrical charge has been released from the capacitor by the short circuit immediately before the sparkplug voltage appears, thus making it possible to maintain the zero point level low substantially equal to the ground voltage level so as to precisely detect the characteristic of the sparkplug voltage waveform.

These and other objects and advantages of the invention will be apparent upon reference to the following specification, attendant claims and drawings.

BRIEF DESCRIPTION OF THE DRAWINGS

FIG. 4 is a schematic view of a sparkplug voltage waveform detecting circuit according to the second embodiment of the invention.

DETAILED DESCRIPTION OF THE EMBODIMENTS

Figure 1:
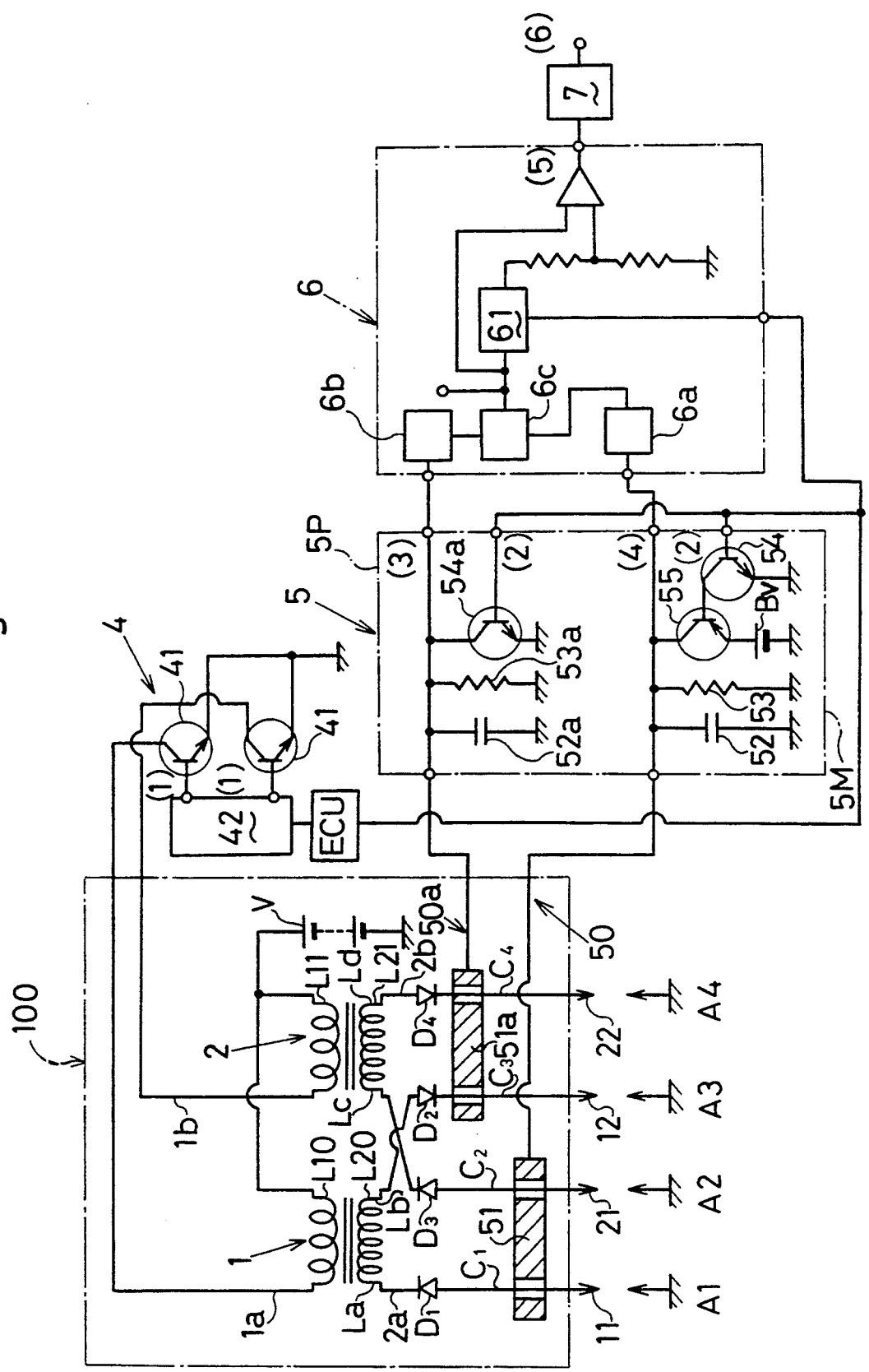
FIG. 1 is a schematic view of an ignition circuit of an internal combustion engine into which a sparkplug voltage detecting probe device is incorporated according to a first embodiment of the invention.

Referring to FIG. 1 which shows a distributorless type ignition device 100 for a four-cylinder internal combustion engine into which a sparkplug voltage detecting probe device is incorporated, the ignition device 100 has ignition coils 1, 2 which in turn includes primary circuits 1a, 1b and secondary circuit 2a, 2b with a vehicular battery cell (V) as a power source. The primary circuits 1a, 1b have primary coils (L10), (L11) each electrically connected in series with a switching device 41 and a signal generator 42, while the secondary circuits 2a, 2b have secondary coils (L20), (L21) respectively. By way of a diode D1 and a cable C1, one end (La) of the secondary coil (L20) is connected to a spark plug 11 in a first cylinder A1 of the internal combustion engine. By way of a diode D2, and a cable C3, the other end (Lb) of the secondary coil (L20) is connected to a spark plug 12 in a third cylinder A3 of the internal combustion engine. By way of a diode D3 and a cable G2, one end (Lc) of the secondary coil (L21) is connected to a spark plug 21 in a second cylinder A2 of the internal combustion engine. By way of a diode D4, and a cable C4, the other end (Ld) of the secondary coil (L21) is connected to a spark plug 22 in a fourth cylinder A4 of the internal combustion engine.

The switching device 41 and the signal generator 42 forms an interrupter circuit 4 which detects a crank angle and a throttling degree of the engine by means of an electronic control unit (ECU). The interrupter circuit 4 on-off actuates a primary current flowing through the primary coils (L10), (L11) to induce a sparkplug voltage in the secondary coils (L20), (L21) of the secondary circuits 2a, 2b in a way that the timing of the spark action corresponds to an advancement angle relevant to a revolution and a load of the engine.

The sparkplug voltage detecting probe device according to the present invention includes a voltage divider circuit 5 and a sparkplug voltage waveform detecting circuit 6. The voltage divider circuit 5 divides a sparkplug voltage drawing through the cables C1~C4 to the spark plugs 11, 21, 12 and 22. The sparkplug voltage waveform detecting circuit 6 detects a sparkplug voltage waveform on the base of the output from the voltage divider circuit 5. To the sparkplug voltage waveform detecting circuit 6, a distinction circuit 7 is connected to analyse the sparkplug voltage waveform so as to detect whether or not a misfire occurs in the cylinders A1~A4 of the internal combustion engine.

The voltage divider circuit 5 has a positive side voltage divider 5P and a negative side voltage divider 5M. In the dividers 5P, 5M, sensor 51, 51a are provided respectively in the form of rectangular insulator so as to form a static capacity (1 pF) between the sensor 51 and the cables C1, C2, and at the same time, forming a static capacity (1 pF) between the sensor 51a and the cables C3, C4. Sparkplug voltage dividing circuits 50, 50a are provided as capacitors 52, 52a (3000 pF). The capacitor 52 is connected between the sensor 51 and the ground. In parallel with the capacitor 52, a resistor 53 is connected as a release circuit to define a time constant of a RG path. By way of a battery cell (Bv), a PNP transistor 55 is connected in parallel with the resistor 53, a base of which is connected to a collector of an NPN transistor 54 to serve as a short circuit which is adapted to instantaneously release an electrical charge from the capacitor 52 immediately before establishing a spark voltage for the spark plug.

Meanwhile, the capacitor 52a is connected between the sensor 51a and the ground. In parallel with the capacitor 52a, a resistor 53a is connected as a release circuit to define a time constant of a RC path. In parallel with the resistor 53a, an NPN transistor 54a is connected to serve as a short circuit which is adapted to instantaneously release an electrical charge from the capacitor 52a immediately before establishing the spark voltage for the spark plug. To the base of each of the transistors 54, 54a, is the electronic control unit (ECU) connected which generates a reset pulse signal immediately before the end of the spark action. The sparkplug voltage dividing circuit 50 is connected to an adder circuit 6c by way of an inverse operational amplifier 6a, while the sparkplug voltage dividing circuit 50a is connected to an adder circuit 6c by way of an operational amplifier 6b.

The voltage dividers 5P, 5M divide the sparkplug voltage induced from the secondary circuit 2a by the order of 1/3000, which makes it possible to determine the time constant of RC (R:2MΩ) path to be approximately 6 milliseconds to render an attenuation time length of the sparkplug voltage waveform relatively longer (3 milliseconds) as described hereinafter.

In this instance, the sparkplug voltage 30000 V divided to the level of 10 V is inputted to the sparkplug voltage waveform detecting circuit 6 to which the adder circuit 6c is connected. Immediately before initiating the spark action, the electronic control unit (ECU) generates the reset pulse signal to energize the transistors 54, 54a so as to instantaneously release the electrical charge from the capacitors 52, 52a.

The sparkplug voltage detecting circuit 6 has a peak hold circuit 61 which is reset by an on-signal (inversion to high level) from the signal generator 41, and receives a sampling signal from the ECU to detect a peak hold level at a predetermined elapse of time after initiating the spark action so as to detect a step-up level of the sparkplug voltage after the end of the spark action.

Figure 2:
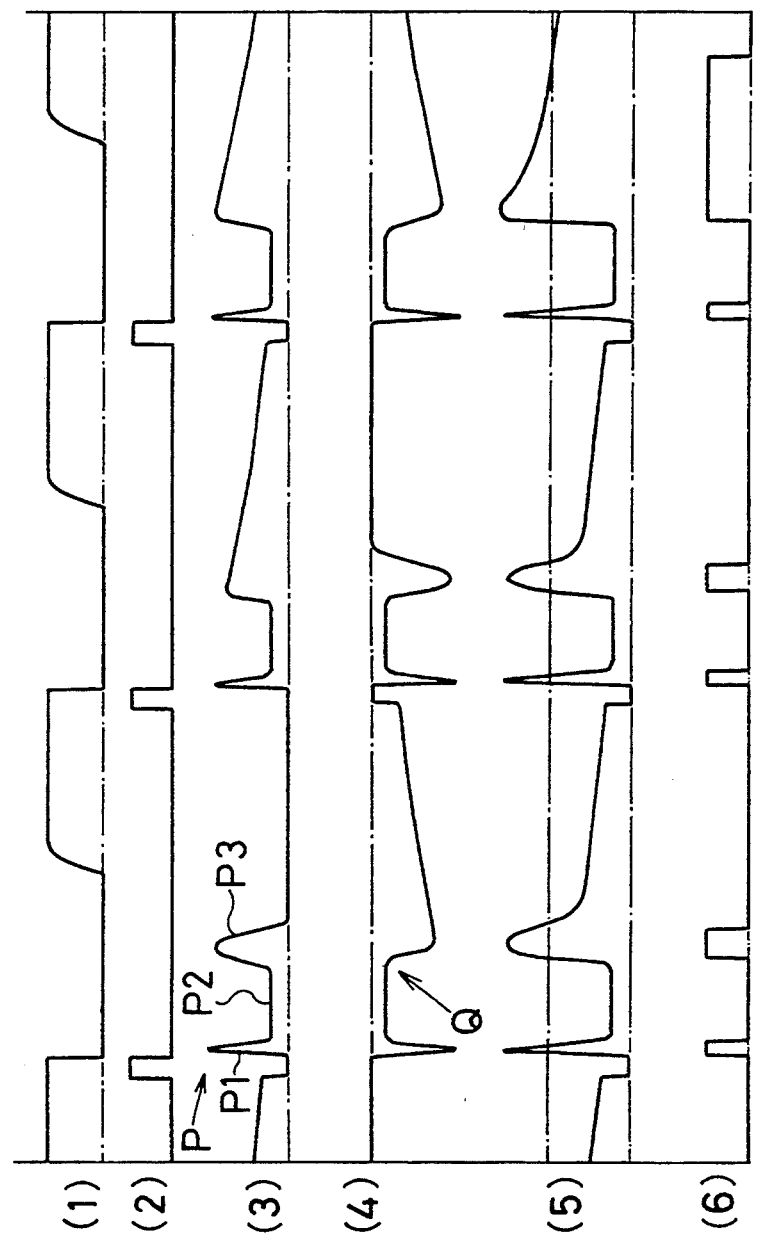
FIG. 2 is a view of a sparkplug voltage waveform shown for the purpose of explaining how the sparkplug voltage waveform detecting circuit works.

With the structure thus far described, the signal generator 42 of the interrupter circuit 4 outputs pulse signals as shown at (1) in FIG. 2 in order to induce the primary current in the primary circuits 1a, 1b as shown at (2) in FIG. 2. The ECU generates the reset pulse signal immediately before the end of the spark action as shown at (2) in FIG. 2. By means of the reset pulse signal, the electrical charge is instantaneously released from the capacitors 52, 52a through the transistors 54, 54a immediately before establishing the spark voltage for the spark plugs in the cylinders A1~A4 of the internal combusiton engine. This makes it possible to make the reference voltage level substantially equal to the ground voltage level so as to generate a sparkplug voltage waveform as shown at (3), (4) in FIG. 2.

The spark voltage waveform P has short and tall waveform P1 caused from an capacitive discharge which accompanies with a gradual waveform P2 caused from an inductive discharge. As the end of the spark action approaches, the sparkplug voltage increases to show a peak voltage P3 to serve as a step-up voltage.

Meanwhile, the voltage waveform level Q of the ineffective spark discharge is approximately half of that of the normal spark action, and having a longer attenuation time of the step-up voltage level than the waveform P1 has after the end of the spark action. This is because the ineffective spark discharge occurs in a stroke of exhaustion in which no ionized particles are present around the spark gap of the spark plug. That is to say, the voltage waveform level Q of the ineffective spark discharge has the longer attenuation time the same as the normal spark has when the misfire occurs in a stroke of combustion.

In the sparkplug voltage waveform detecting circuit 6, the peak hold circuit 61 is reset by the ECU in synchronization with the on-signal (inverse to high level) of the signal generator 42 as shown at (5) in FIG. 2. The peak hold circuit 61 holds the peak voltage level stepped up after the end of the spark action, and outputs the attenuation time length necessary to descend the sparkplug voltage to half of the peak voltage level by way of example. The distinction circuit 7 determines that the misfire occurs when a pulse width exceeds a predetermined level as shown at (6) in FIG. 2.

Figure 3:
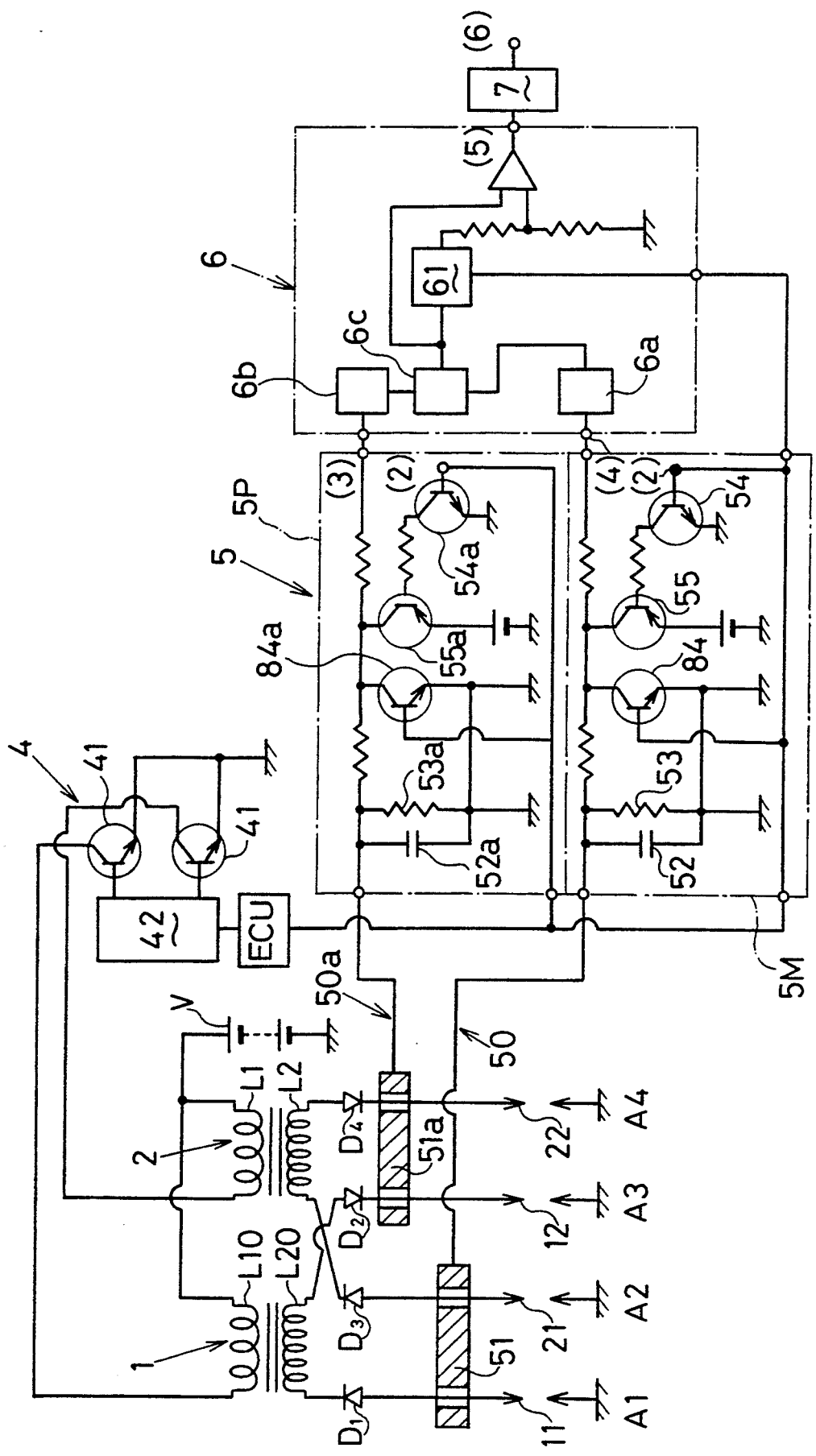
FIG. 3 is a view similar to FIG. 1 according to a second embodiment of the invention.

FIG. 3 shows a second embodiment of the invention which differs from the first embodiment in that a PNP transistor 55a is provided in the positive side divider 5P as provided in the first embodiment of the invention. There are also provided NPN transistors 84a, 84 each connected in parallel with the capacitors 52a, 52 in the positive side divider 5P and the negative side devider 5M in the second embodiment of the invention.

In the positive side divider 5P and the negative side divider 5M, NPN transistors 84a, 84 are in turn connected in parallel with the capacitors 52a, 52 in the second embodiment of the invention.

In the positive side divider 5P and the negative side divider 5M, the transistors 55, 54 (55a, 54a) are energized by the reset pulse signal outputted from the ECU immediately after initiating the spark action so as to instantaneously release the electrical charge from the capacitors 52a, 52. In this instance, the ECU generates the reset pulse signal during the time from which a high sparkplug voltage is generated to which the spark action has initiated. The transistors 54, 54a short-circuit the secondary circuits 2a, 2b respectively when it takes long time to release the sparkplug voltage so that the subsequent spark action is initiated to rise the reference voltage level to the positive side from the ground voltage level before the stray capacity charge inherent in the spark plugs is not completely released. The transistors 55, 55a short-circuit the secondary circuits 2a, 2b when the reference voltage level drops to the negative side from the ground voltage level.

The the secondary circuits 2a, 2b are short-circuited by the reset pulse signal immediately after the end of the spark action because the sparkplug voltage level immediately after initiating the spark action is generally constant irrespective of the amount of the stray capacity charge left in the spark plugs. However, it is appropriate to output the reset pulse signal during 50~100 µs after initiating the spark action when considered that the time passes after initiating the spark action to a degree that the inductive discharge voltage has increased depending on the running condition of the internal combustion engine.

In FIG. 4, the ignition coils 1, 2 are energized by the signal generator 42 as shown at (1). The ECU generates the reset pulse signal immediately after initiating the spark action as shown at (2) in FIG. 4. This makes it possible to instantaneously release the sparkplug voltage of the spark plugs so as to set the reference voltage level to the ground voltage level as shown at (3), (4) in FIG. 4. The sparkplug voltage waveform detecting circuit 6 holds the peak voltage level stepped up after the end of the spark action, and outputting a time signal as the attenuation time length necessary to descent the sparkplug voltage to half the peak voltage level as shown at (5) in FIG. 4 by way of illustration. The distinction circuit 7 determines that the misfire occurs when a pulse width exceeds a predetermined level as shown at (6) in FIG. 4.

It is noted the sparkplug voltage detecting probe device is incorporated into the dual polarity type DLI in these embodiment of the invention, but it is as a matter of course that the probe device may be incorporated into a single polarity type DLI. The probe device may be incorporated into an ignitor device in which a distributor is equipped.

While the invention has been described with reference to the specific embodiments, it is understood that this description is not to be construed in a limiting sense in as much as various modifications and additions to the specific embodiments may be made by skilled artisan without departing from the spirit and scope of the invention.

What is claimed is:

1. A sparkplug voltage detecting probe device for use in internal combustion engine comprising:
   a sensor provided to form a static capacity between the sensor and a secondary circuit of an ignition coil which is connected a spark plug;
   a sparkplug voltage divider circuit having a capacitor connected between the sensor and the ground;
   a release circuit having a resistor connected in parallel with the capacitor so as to provide a time constant of a RC path;
   a short circuit provided to instantaneously release an electrical charge from the capacitor either immediately before establishing a spark voltage for the spark plug or immediately after initiating the spark action of the spark plug; and
   a sparkplug voltage waveform detecting circuit which detects a sparkplug voltage waveform divided by the sparkplug voltage divider circuit.

2. A sparkplug voltage detecting probe device as recited in claim 1, wherein the short circuit includes a transistor which is connected in parallel with the release circuit.

3. A sparkplug voltage detecting probe device as recited in claim 1, wherein the short circuit includes a first PNP transistor and a first NPN transistor each connected in parallel with the capacitor, each base of which is connected to an electronic control unit which generates a reset pulse to energize either one of the two transistors immediately after initiating the spark action of the spark plug.

4. A sparkplug voltage detecting probe device as recited in claim 3, wherein the short circuit further includes a second NPN transistor provided between the first PNP transistor and the electronic control unit, a collector of the second NPN transistor being connected to the base of the first PNP transistor, while a base of the second NPN transistor being connected to the electronic control unit.

* * * * *